(12) United States Patent
Sun et al.

(10) Patent No.: US 11,481,309 B2
(45) Date of Patent: Oct. 25, 2022

(54) CAPABILITY TEST METHOD BASED ON JOINT TEST SUPPORT PLATFORM

(71) Applicant: Harbin Institute of Technology, Heilongjiang (CN)

(72) Inventors: Chao Sun, Harbin (CN); Shouda Jiang, Harbin (CN); Jingli Yang, Harbin (CN); Chang'An Wei, Harbin (CN)

(*) Notice: Subject to any disclaimer, the term of this patent is extended or adjusted under 35 U.S.C. 154(b) by 63 days.

(21) Appl. No.: 17/033,802

(22) Filed: Sep. 27, 2020

(65) Prior Publication Data
US 2021/0019251 A1    Jan. 21, 2021

(30) Foreign Application Priority Data
Jul. 29, 2020   (CN) .......................... 202010744470.4

(51) Int. Cl.
| | | |
|---|---|---|
| G06F 11/36 | (2006.01) | |
| G06F 11/34 | (2006.01) | |
| G01R 31/317 | (2006.01) | |
| G06F 11/22 | (2006.01) | |
| G01R 31/28 | (2006.01) | |

(52) U.S. Cl.
CPC ........ *G06F 11/3684* (2013.01); *G01R 31/282* (2013.01); *G01R 31/31707* (2013.01); *G06F 11/2236* (2013.01); *G06F 11/2273* (2013.01); *G06F 11/3409* (2013.01); *G06F 11/3447* (2013.01); *G06F 11/3688* (2013.01); *G06F 11/3692* (2013.01)

(58) Field of Classification Search
CPC ............. G06F 11/3684; G06F 11/2236; G06F 11/2273; G06F 11/3409; G06F 11/3447; G06F 11/3688; G06F 11/3692; G06F 30/20; G01R 31/282; G01R 31/31707; G06Q 10/0637
USPC ......................................................... 714/742
See application file for complete search history.

(56) References Cited

U.S. PATENT DOCUMENTS

2019/0065351 A1*   2/2019   Rakhmilevich ....... G06F 9/4856

\* cited by examiner

*Primary Examiner* — James C Kerveros
(74) *Attorney, Agent, or Firm* — W&K IP

(57) ABSTRACT

Disclosed is a capability test method based on a joint test support platform. The method includes steps of describing an initial capability in a test, combining a capability to be developed based on the initial capability, and determining an evaluation strategy and a joint task background information of the test. Further, the method includes generating a logical shooting range for the joint test support platform according to the joint task background information, developing a test scenario according to the joint task background information and the logical shooting range, decomposing the test scenario, determining a test plan corresponding to the test scenario, executing the test according to the test plan, analyzing and evaluating a test result of the test, and generating one or more joint capability evaluation reports for the test.

10 Claims, 10 Drawing Sheets

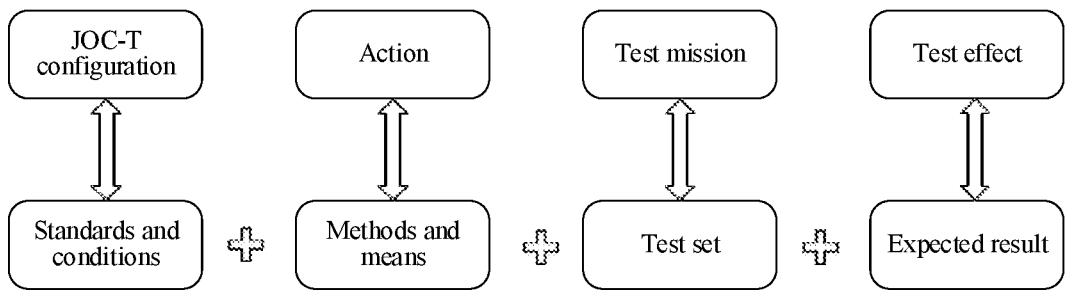

A certain joint capability = the ability to achieve the expected effect of D through B method and means under A standards and conditions to perform C task set.

Key Capability issue 1 = Evaluate the capability to achieve the expected effect of D by implementing B methods and means under A standards and conditions.

Key Capability issue 2 = in order to achieve the expected effect of D, can the C task set be successfully executed under the A standard and conditions through the B methods and means?

FIG. 4

CAPABILITY TEST METHOD BASED ON JOINT TEST SUPPORT PLATFORM

TECHNICAL FIELD

The disclosure relates to the technical field of equipment/system joint test, and more specifically, to a capability test method based on a joint test support platform.

BACKGROUND

The equipment/system task test is a complex system engineering. It is an equipment/system test activity to assess and evaluate task efficiency, guarantee efficiency, applicability, task satisfaction and quality stability of the equipment/system, based on the equipment/system's mission and task, under the conditions of approximate real application, in accordance with the task process. equipment/system test design refers to the overall planning and appropriate arrangement of all aspects, links and the entire process of the test work according to the test object and purpose before the equipment/system test is implemented. This process is called test design. Test design is the planning of the entire test process and is the core part of the task test. It determines how the task test implementation process is carried out and is a key link in determining the success of the test.

Therefore, the equipment/system task test design is such a process. Before the equipment/system enters the task test implementation phase, based on the task and capability requirements of the tested equipment/system, the task test purpose is scientifically determined, the test resources are comprehensively considered, the task test is scientifically planned, and the test method is scientifically determined, and finally a scientific and effective task test plan is formed.

The existing mature test design process is mission-driven. The so-called mission-driven is to construct task scenarios directly based on task/mission requirements, then to run tests using the test platform, and finally to collect and analyze the generated test data. This type of test mode is unable to learn from previous tests performed when the test missions is similar or inclusive. Therefore, the current design process of joint tests can easily lead to a large amount of repetitive work, resulting in the waste of resources. It can only achieve flat test development, and cannot achieve the cycle of capabilities throughout the test process. The program design stage cannot be directly related to the capabilities determined in the requirements definition stage.

Therefore, how to provide a device/system test design method that can be directly related to the capabilities of the previous device/system test is an urgent problem for those skilled in the field to solve.

SUMMARY

For this reason, the present invention provides a capability test method based on a joint test support platform, which can directly reference previous test equipment/systems in the form of capability in the test design phase, thereby continuously iterate in the entire test system to achieve cumulative development of equipment/system test.

In order to achieve the above objectives, the present invention adopts the following technical solution: a capability test method based on a joint test support platform is provided. The capability is defined as an ability to perform tasks to achieve the expected results through various methods and means under specific standards and conditions.

The capability test method includes the following steps.

S1: describing an initial capability in a test, and determining an evaluation strategy and a joint task background information of the test according to the capability to be developed based on the initial capability.

S2: generating a logical shooting range for the joint test support platform according to the joint task background information.

S3: developing a test scenario according to the joint task background information and the logical shooting range, decomposing the test scenario, and determining a test plan corresponding to the test scenario.

S4: performing the test according to the test plan; and

S5: analyzing and evaluating test results of the test, and generating one or more joint capability evaluation reports for the test.

According to the above technical solutions, compared with the current technology, by describing the capabilities of the test, mark and encapsulate the equipment/systems participating in this test. When the capabilities to be achieved in the next test is similar to that achieved in the previous test or when the capabilities realized by previous tests are included, the previous test equipment/systems can be directly quoted in the form of capabilities during the test design stage, so as to continuously iterate through the entire test system to achieve cumulative development of equipment/system tests. By distinguishing the requirements definition phase and the test plan design phase, the design work in the requirement definition phase is platform-independent and compatible with multiple platforms.

Preferably, in the above-mentioned capability test method based on a joint test support platform, S1 includes: S11: formulating capability information and test information. The capability information is information describing the capability. The test information is information describing the test; The capability is divided into an initial capability, a developing capability, and an output ability according to the conversion method of the capability in the whole test design stage. The initial capability is defined as a joint capability of the test object relying on its own equipment/system or a known combination of systems or SoS at the initial stage of the test. The developing capability is defined as a joint capability formed by the test object according to the higher-level task instructions of dividing at the test planning stage. The output capability is defined as an actual output joint capability of the test evaluation analysis stage.

S12: developing joint task background information.

Retrieving from the basic model database of the joint test environment according to the capability information and test information formulated in S11, and selecting the basic model of the joint test environment suitable for the test.

Selecting the equipment/system resource model and environmental resource model to participate in the test according to the selected basic model of the joint test environment.

Adding a task interaction relationship between the equipment/system resource model and the environmental resource model participating in the experiment to generate joint task background information.

Verifying a consistency and completeness of the generated joint task background information.

S13: developing an evaluation strategy.

Collecting evaluation information.

Determining a key capability issue and key task issue according to the capability information in S11.

Establishing an evaluation strategy framework.

The present invention realizes the cycle of capability by dividing the manifestations of capability in different test stages. By citing key capability issues, the capabilities determined at the test plan design stage and the requirements definition stage are directly related.

Preferably, in the above-mentioned capability test method based on a joint test support platform, the equipment/system resource model includes a first-level platform model and a second-level platform model; and the environmental resource model includes a physical environment and a human environment.

Preferably, in the above-mentioned capability test method based on a joint test support platform, the evaluation information in S13 includes the evaluation subject, the evaluation function, the evaluation area, the evaluation capability, and the evaluation capability level. The evaluation subject is defined as the equipment, personnel or institutions for collecting the results of test performance and quantitatively and qualitatively evaluate the results of test performance in the evaluation process. The evaluation function is defined as the behaviors and actions that the evaluation subject must perform during the evaluation process. The evaluation area is defined as the task test area to be evaluated which the evaluation subject defines based on the evaluation function; the evaluation capability is defined as the related capability to be evaluated. The capability level is defined as the capability evaluation standard for evaluating and dividing the joint capability to be evaluated.

Preferably, in the above-mentioned capability test method based on the joint test support platform, the key capability issue in S13 is analytical statement for evaluating the performance of the joint mission related capability. The basic elements of the key capability issue include task set, mission expected effect, test standard, test condition, test method, and test means. The key task issue is defined as the analytical statement of design task efficiency and mission adaptability;

The evaluation strategy framework is divided into independent factors and dependent factors according to the measured dependence. The independent factor includes joint missions and task, environmental conditions, and system configuration options. The dependent factor includes joint mission effectiveness measurement, task performance measurement and system property measurement.

Preferably, in the above-mentioned capability test method based on a joint test support platform, S2 includes:

S21: instantiating a test resource. Selecting the subordinate components of test resource in the basic model of the joint test environment to instantiate them.

S22: adding a test node. Determining the physical node running by the component according to the instantiated component, so that the test resource participates in the test at the correct physical node.

S23: generating an intermediate plug-in. Generated a dynamic link library is to realize data transmission among test resources according to the basic model of the joint test environment corresponding to all test resources in the logical shooting range.

Preferably, in the above-mentioned capability test method based on the joint test support platform, S3 includes:

S31: developing a test scenario. The test scenario is a brief description of the action/interaction relationship between our troops, enemy troops and the environment during the test.

S32: developing a test concept. The developing a test concept includes establishing an overall test goal, establishing a test purpose, and determining a test sequence.

S33: developing a test design according to the test concept and the test scenario. The test design is a specific plan during the test operation.

Preferably, in the above-mentioned capability test method based on the joint test support platform, S32 includes:

S321: establishing an overall test goal. Obtaining the joint task goal of this test according to the joint task background information in S12. Associating the available joint task goal with the available key capability issues in S13. Integrating stakeholders, capability and joint mission objectives into an overall test goal.

S322: developing a test purpose. Decomposing the global test goal in step S321 into test purpose according to the key capability issues in S13, and each test purpose is based on a specific key capability issue.

S323: determining the test sequence. Sorting the developed test purposes according to priority and time.

Preferably, in the above-mentioned capability test method based on a joint test support platform, S33 includes:

S331: developing test fragments.

Decomposing the test scenario specified in step S31 into a plurality of test fragments as a test event during test operation by taking the test purposes in S32 as a reference.

S332: configuring the subscription release relationship.

Adding a subscription release relationship for the task interaction relationship among test resources, and determining the data transmission relationship and type among test resources.

S333: formulating a data collection plan.

Determining the key capability indicators that the current test fragment needs to collect according to the test fragments in S331 and the corresponding key capability issues, and formulating corresponding data collection plans.

S334: designing test samples.

Developing a corresponding test sample is formulated for each test fragment according to the key capability indicators and the data collection plan in S331.

Preferably, in the above-mentioned capability test method based on the joint test support platform, S334 includes:

S3341: selecting test objects, and setting test attributes and parameters.

S3342: select test factors from each test object.

S3343: setting the number of test levels and level values for each participating test factor according to the key capability indicator and data collection plan in S331.

S3344: selecting a test design method suitable for the selected test factors.

S3345: generating test samples according to the test design method.

BRIEF DESCRIPTION OF THE DRAWINGS

In order to explain the embodiments of the present invention or the technical solutions in the prior art more clearly, the following will briefly introduce the drawings that need to be used in the description of the embodiments or the prior art. Obviously, the drawings in the following description are only embodiments of the present invention. For those of ordinary skill in the art, other drawings can be obtained based on the provided drawings without creative work.

FIG. 4 is an example diagram of the key capability issue provided by the present invention;

DETAILED DESCRIPTION OF EMBODIMENTS

The technical solutions in the embodiments of the present invention will be clearly and completely described below in conjunction with the accompanying drawings in the embodiments of the present invention. Obviously, the described embodiments are only a part of the embodiments of the present invention, rather than all the embodiments. Based on the embodiments of the present invention, all other embodiments obtained by those of ordinary skill in the art without creative work shall fall within the protection scope of the present invention.

Figure 1:
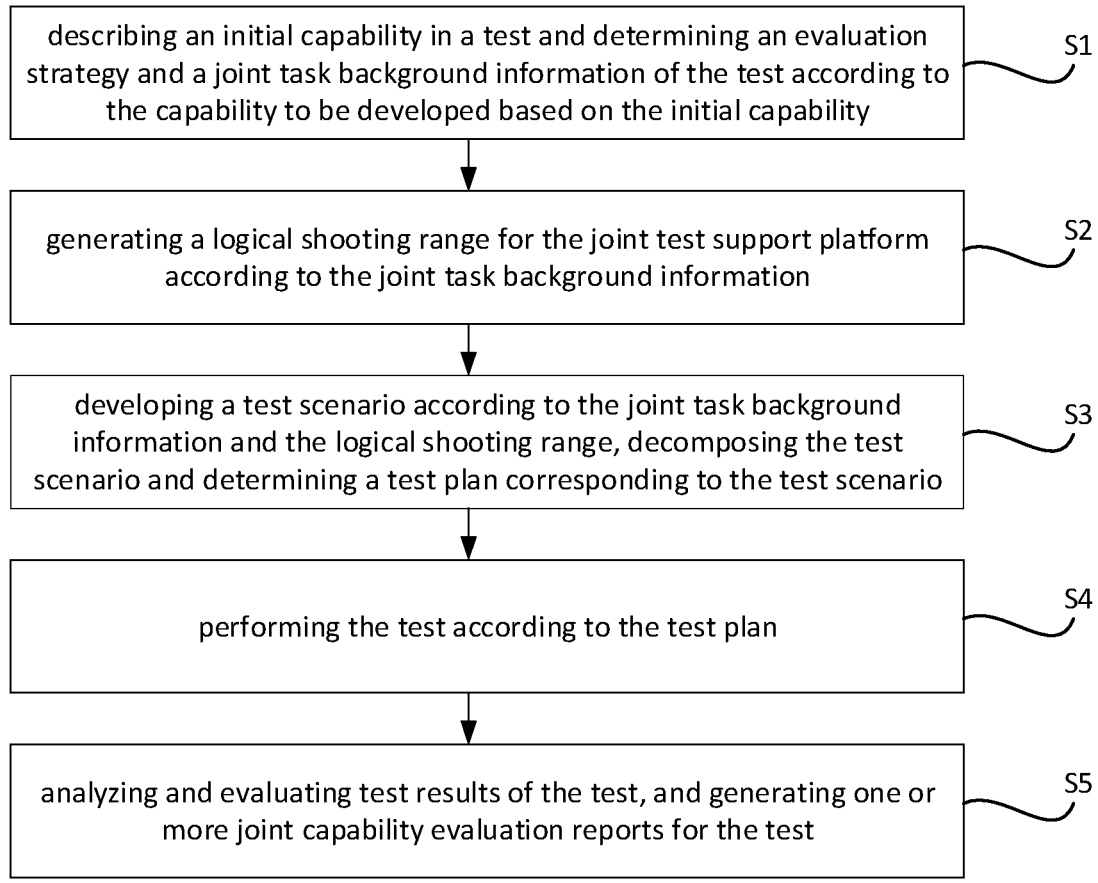
FIG. 1 is a flowchart provided by the present invention.

Referring to FIG. 1, the embodiment of the present invention discloses a capability test method based on a joint test support platform. Capability refers to the ability to perform tasks to achieve the expected results through various methods and means under specific standards and conditions; It is characterized by the following steps: S1: describing the initial capability in this test, and determining the evaluation strategy and the background information of the joint task of the test according to the capability to be developed based on the initial capability.

S2: generating a logical shooting range for the joint test support platform according to the joint task background information;

S3: developing a test scenario according to the background information of the joint task and the logical shooting range, decompose the test scenario, and determining a test plan corresponding to the test scenario;

S4, performing the test according to the test plan; and

S5: analyzing and evaluating the test results of the test, and generating one or more joint capability assessment reports for the test.

Among them, S1 produces two key products: the description of the Joint Operational Context for Test (JOC-T) of evaluation strategy and test. JOC-T describes the operating environment in which the system or capability is about to perform its mission. The evaluation strategy establishes a method to verify whether the system or capability actually meets its development requirements.

S2 converts the JOC-T generated in step S1 into a logical shooting range, and determines the resource model in JOC-T as a component that can directly participate in the test. This step will generate a logical shooting range to configure components and object models for subsequent test execution.

S3 designs the test based on the products generated in the steps S1 and S2, formulates the test scenario, concept and fragment, and determines the specific test plan.

S4 is the execution stage of the test. The test execution platform loads and runs the test plan formulated in S3 to complete the test. S5 analyzes and evaluates the test data generated after the test is executed, and finally generates one or more joint capability evaluation reports.

The steps S1-S3 of the present invention will be described in detail below.

Figure 2:
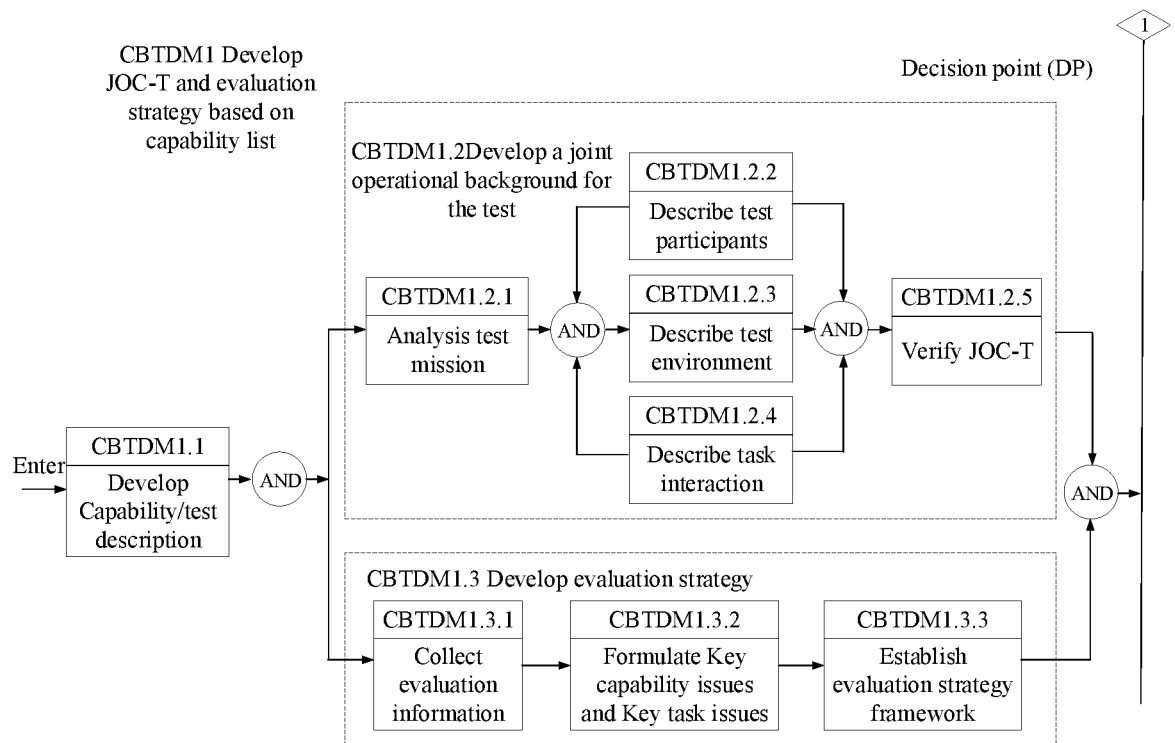
FIG. 2 is a flowchart of step S1 provided by the present invention.
Figure 3:
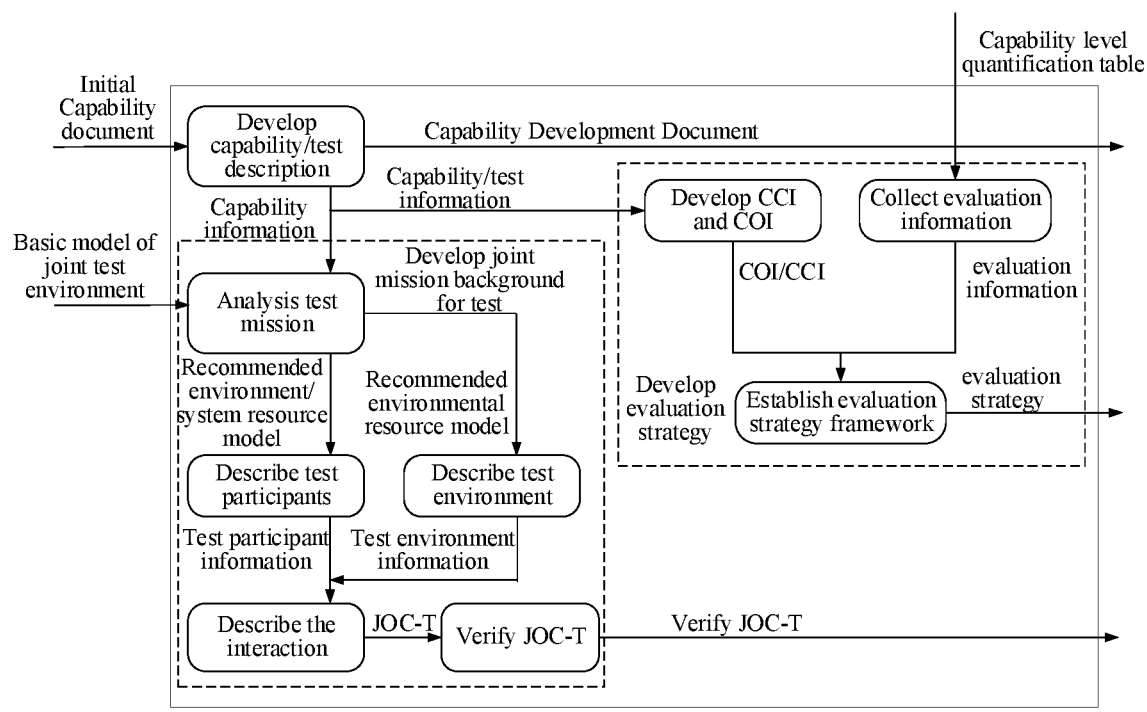
FIG. 3 is an information flow diagram of step S1 provided by the present invention.

(1) As shown in FIG. 2-3, step S extracts capability/test information from the initial capability document to formulate capability/test descriptions, and uses the formulated capability/test descriptions to assist in the development of JOC-T and evaluation strategies for use in subsequent steps.

Step S1 includes:

Step S11: formulating capability information and test information.

For the first step of test design, describing the capability to conduct the test, explaining the various attribute parameters of the capability to conduct the test, and formulate the capability/test description to extract the capability/test information related to the test from the relevant system files. The test designer selects/combines the information, and completes the description of each attribute parameter of the capability for use in subsequent steps.

Capability information is information describing capabilities, including capability keywords, capability text descriptions, capability parameter lists, and system attribute lists. Among them, the capability keyword is a brief description of the joint ability; the capability text description is the necessary explanation and supplementary description of the capability; the capability parameter list is a collection of multiple parameters related to the capability; in general, the parameters should be numerical values with the corresponding unit. The system attribute list refers to a collection of multiple attributes of weapon equipment, systems, or SoS related to the capability.

The capability information is stored in the capability file, and the capability is divided into the initial capability, the developing capability, and the output capability according to the test design stage of the capability. Initial capability refers to the joint capability of the test object relying on its own equipment/system or the known combination of systems or SoS at the initial stage of the test, and it is stored in the Initial Capability Document (ICD); the developing capability refers to the joint capability which is formed by the test object dividing according to the higher-level task instructions at the test planning stage, and it is stored in the Capability Development Document (CDD); the output capacity refers to the joint capacity actually derived during the evaluation and analysis stage, and is stored in the Capability Production Document (CPD). It should be pointed out that after the evaluation is completed and the output capability is derived, it can be used as an initial capability to participate in the next test design process based on capability.

A list of initial capability description information composed of multiple capability description information is stored in the initial capability document (ICD). The test designer loads the initial capability by importing the initial capability document, then combines the initial capability and selects the key capability indicators that this test cares about, and imports the combined capability information into the capability development document (CDD) for subsequent steps. After the entire test is over, the developed capability information will be written into the capability production document (CPD).

Test information is the information describing the test, including test name, test mission statement, test expected results, and test tasks and goals. The test information can be obtained from relevant system files, or it can be added manually by the test designer at this stage.

Step S12: developing the joint task background information.

Realize the capability described in S11, so that the capability can truly participate in the test. The carriers of the capability are all kinds of equipment, which have a variety of capabilities by themselves or in combination. Include the equipment as a trial participant in the test, that is, include the capability into the test. During the test, the operating background of the equipment is the joint task background, which integrates information such as our army, enemy forces, the environment, and the interaction relationship among units, and is used for scenario description of the joint task environment. S12 uses the capability information formulated from capability/test description in Step S1l, and complete the establishment of the joint task background through the basic model of the joint test environment (including equipment resource model and environmental resource model). The process includes the following 5 steps:

S121: analyzing the test mission.

The first step in formulating the joint task background of the test is to analyze the test mission. The analysis process is to retrieve the basic model of the joint test environment (including the equipment resource model and the environmental resource model) based on the capability/test information formulated in S11. The basic model of the joint test environment suitable for this test is selected from the basic model database of test environment, which is used by test designers and lays the foundation for describing test participants and environment.

To analyze and test missions, semantic simplification must be carried out, and extract corresponding text description information from the previously formulated information.

This information includes: mission description, test goals, and expected effects of the mission. Secondly, according to the capability development description information, retrieve the relevant weapon equipment model with the joint capability, and recommend it to the test designer, so that the test designer can quickly select and build a satisfactory joint task background based on the recommended results.

S122: describing test participants.

Participants in the test are the equipment that participates in the test. They are the carriers of capability and the manifestation of capability in the joint task background.

There can be multiple test participants in the joint task background of the test, and the test participants directly promote the test.

In the previous step, the test designer obtained the recommended resource model and test description information related to this test. Therefore, the test designer can use the test description information as a reference at this time, select the appropriate equipment resource model from the recommended resource model as a participant in this test and add it to the test.

S123: describing the test environment.

Describing the operating environment of the equipment resource model. As in step 2) describing the test participants, when describing the test environment, the test designer needs to select a suitable environmental resource model from the recommended resource models as the operating environment of the equipment resource model, and add it to the test.

The environment includes air, water, land, plants, animals and other living things, man-made structures, historical and cultural resources, and their interrelationships. The environment can be classified into two categories: physical environment and humanistic environment. The physical environment includes natural environment and man-made environment, which can be extended to the sky, weather, ocean and space. The physical environment can include external and internal conditions (for example: temperature, humidity, radiation, electric and magnetic fields, shock and vibration, etc.). The humanistic environment includes local customs, economic conditions, ethnic conditions, political and religious sects, the history and relationship of various social groups, and the attitudes of ordinary people towards our and enemy forces.

S124: describing the task interaction.

After adding all resource models, the relationship of the models should be described.

Assuming that there are our own and enemy forces in the joint task background of the test, then the relationship between our test participants and the enemy test participants is a hostile relationship, and the relationship of ourselves test participants or enemy test participants is collaborative relationship. These hostile or cooperative relationships are called task interaction relationships. The task interaction relationship can be divided into two types: attack-defense task relationship and active-passive cooperation relationship. In the task interaction relationship, test participants will pass corresponding data to each other to complete the interaction. Test designer can also use text annotations to convey information such as the special capability of test participants, key issues, the realtime and reliability of task interactions, and the synchronization of the joint task background.

S125: Check JOC-T.

After completing steps 1)-4), the joint task background of the test is completed. In order to ensure the consistency and completeness of the joint task background, the joint task background needs to be verified.

Verification mainly includes the consistency and completeness of joint task. The verification of consistency refers to whether the test participants in the completed joint task background cover the capability/test information described in step S11. The verification of completeness refers to whether the completed joint task background has all the information that it should have. The basic composition of the joint task background information includes: mission description information, description information of our side and the enemy, environment description information, and interaction information. This part mainly verifies whether the test designer has selected the corresponding weapon equipment and environmental resource model based on the test mission and capability development description information, checks whether the parameters/attributes allocated by the resource model are correct, and verifies whether the content of the data type of the task interaction relationship is nonvoid.

Step S13: developing an evaluation strategy.

The evaluation strategy is a blueprint/master plan for evaluating the efficiency of a joint mission of a certain capability. It explains the guidelines that the test evaluator needs to follow in the later stages of the test. The evaluation strategy is formulated during the requirement definition stage of the test. Then, in the subsequent stages of test design and evaluation, the test designer will refer to the needs of the test evaluator to improve the test design plan. When the test evaluator formulates the data collection plan and analysis plan, they must abide by the previously formulated evaluation strategy. The key elements of the evaluation strategy include Critical Capability Issue (CCI), evaluation independent factors and evaluation dependent factors. The key element refers to the element that the test designer needs to pay special attention when formulating the test evaluation strategy. Evaluation of independent factors refers to factors that do not affect each other and are independently evaluated during the evaluation process, including: joint missions and tasks, enemy and environmental conditions, and system configuration options. Evaluation dependent factors refer to the factors that are affected by independent factors in the evaluation process, mainly including: mission measures of effectiveness (MMOE), task measures of performance (TMOP), and Measures of System/SoS attributes (MOSA).

In order to complete the formulation of the evaluation strategy, the following three steps are required.

S131: collecting evaluation information.

The first thing in developing an evaluation strategy is to collect evaluation information, and focus on solving the problems of "who will evaluate" and "evaluation standards".

There are mainly evaluation subject, evaluation function, evaluation area, and joint capability analysis standards.

The evaluation information mainly includes evaluation subject information, evaluation function information, evaluation area information, capability information to be evaluated, and capability level information. The evaluation subject refers to the equipment, personnel or organization that collects the test execution results and evaluates quantitatively and qualitatively during the evaluation process. The evaluation subject information can be a certain test execution or evaluation personnel, it can also be a test measurement equipment or system, or a certain test execution and analysis organization. Evaluation function information is the behavior that the evaluation subject must perform in the evaluation process, and the actions performed. The evaluation area information is the test area for the task to be evaluated that is delineated by the evaluation body based on the evaluation function. There may be overlaps in different test evaluation areas. The capability to be evaluated describes the related capability to be evaluated. The capability level information refers to the capability evaluation standard to evaluate and classify the joint capability to be evaluated.

S132: developing a key capability issue and a key task issue.

The most important thing in developing an evaluation strategy is to formulate critical capability issue (CCI) and critical operational issue (COI). CCI is the evaluation object and solves the "what to evaluate" problem. COI is the problems caused by the capability gap and need to be paid attention to in the evaluation.

The key capability issue is an analytical statement that evaluates the performance of the joint mission related competence. Its basic elements include: task set, mission expected effect, test standards and conditions, test methods and means. It is generally described as: evaluating the capability to achieve the expected effect of D through B methods and means under A standards and conditions, as shown in FIG. 4, where the standards and conditions are the configuration information of JOC-T, and the methods and means are the task action information in the JOC-T information. The task set is the test mission in the test information, and the expected effect is the test effect in the test information. According to the corresponding information of the above CCI basic elements, the corresponding information is extracted from the previous steps to complete the formulation of CCI.

The key task issue is analytical expressions involving task effectiveness and task adaptability. They are more used to describe the risks faced by a mission test system, that is, problems that require additional attention/avoidance when developing new joint capability. Defining the key mission issue needs to rely on capability gap (CG). The so-called capability gap refers to the shortcomings between the developing joint capability and the initial capability. These shortcomings may be due to the absence of such capabilities, and the indicators of the existing initial joint capabilities do not meet the requirements, and the existing initial joint capability needs to recombine, etc. In the process of defining key task issue, in addition to referring to the joint task background of the test, the content in the initial capability description information and the capability development description information should also be cited.

S133: establishing an evaluation strategy framework.

Establishing an evaluation strategy framework is the core issue of establishing an evaluation strategy. It summarizes the evaluation methodology and supporting test strategies centered on the joint mission, including the basic tasks and system capability that contribute to the effectiveness, applicability and survivability of the task. The main purpose of this framework is to provide reference materials that can be quickly consulted for subsequent test design and test evaluation and analysis. Through the framework of the table, you can know the response variables that a task/capability needs to pay attention to when evaluating and measuring, you can also know the overview of the test design, and have a forward-looking understanding of the resources and test cycles used in the test.

The establishment of an evaluation strategy framework focuses on solving the problem of "evaluation methods", that is, what basic methods are used to measure and collect data for each evaluation object. The evaluation strategy framework does not target any specific measurement method. It only stipulates that for a certain evaluation object, a data measurement and collection plan need to be formulated in accordance with this framework.

The test evaluation strategy framework can be divided into independent factors and dependent factors according to the measured dependence. Among them, the independent factors evaluated mainly include: joint mission and task, environmental conditions, and system configuration options. The dependent factors mainly include: joint mission effectiveness measurement, task performance measurement, and system attribute measurement.

The evaluation strategy framework can determine the goal of the test, the quantitative measurement centered on the joint mission, the key points of the test design, the test resources, and the test period. The goal of the test focuses more on the task mission and/or capability being evaluated, and links each mission or capability with at least one mission-centric quantitative measurement to identify some available key capability issues or key task issues. Quantitative measurement centered on the joint mission points out more of the response variables that need to be quantitatively measured in the evaluation process, and it is impossible to express detailed and specific measurement methods or procedures. Related measurement methods or procedures can be to implemented until the test design stage. Some of these response variables are key capability parameters, and some are key system attributes. The quantitative measurement centered on the joint mission mainly involves related response variables such as task effectiveness, task fitness and survival. The key points of test design mainly involve information such as the name of the test design, test points and examples. These test design points are mainly to provide follow-up test designers with relevant guidance for designing test plan. Test resources briefly restate and evaluate the resources or weapon equipment set needed by the mission or joint capability. The test period briefly describes the evaluation period of the mission or joint capability.

Figure 5:
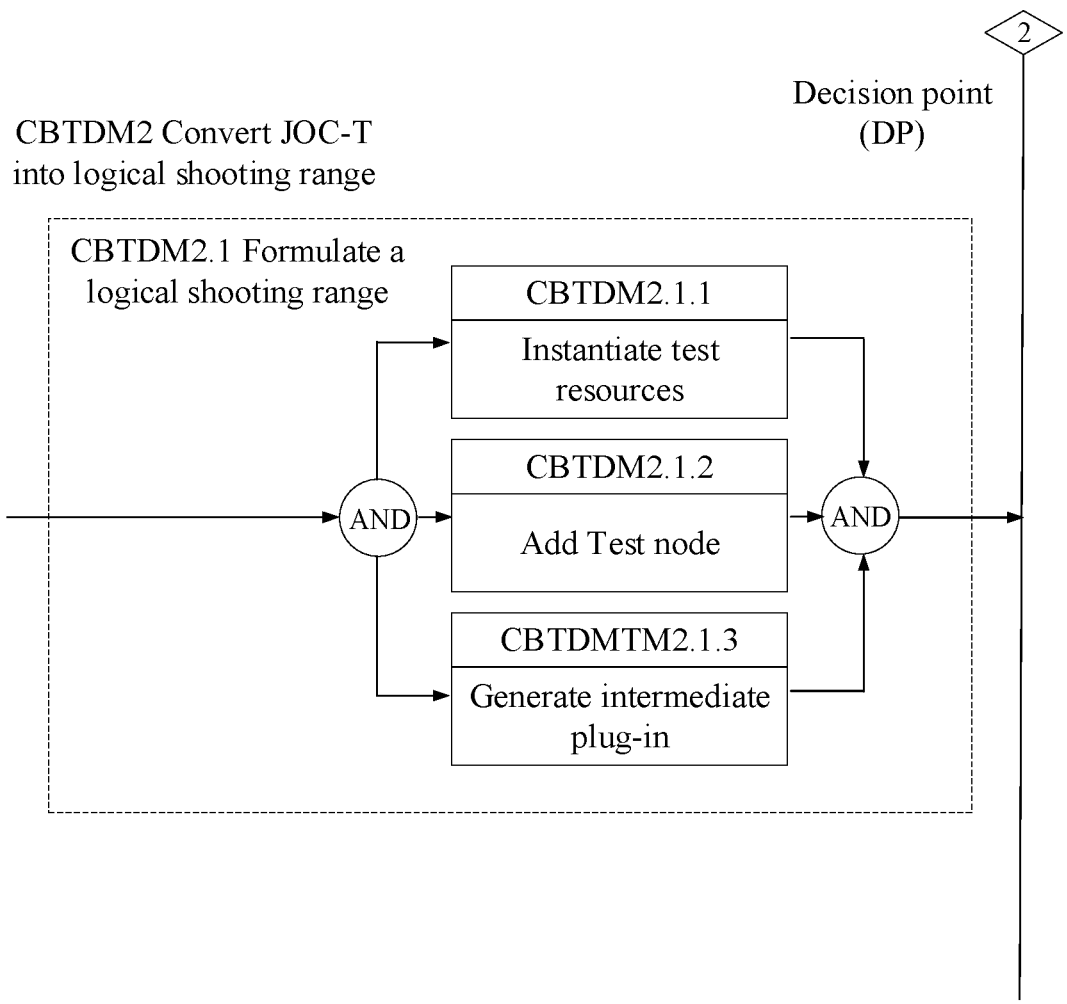
FIG. 5 is a flowchart of step S2 provided by the present invention.
Figure 6:
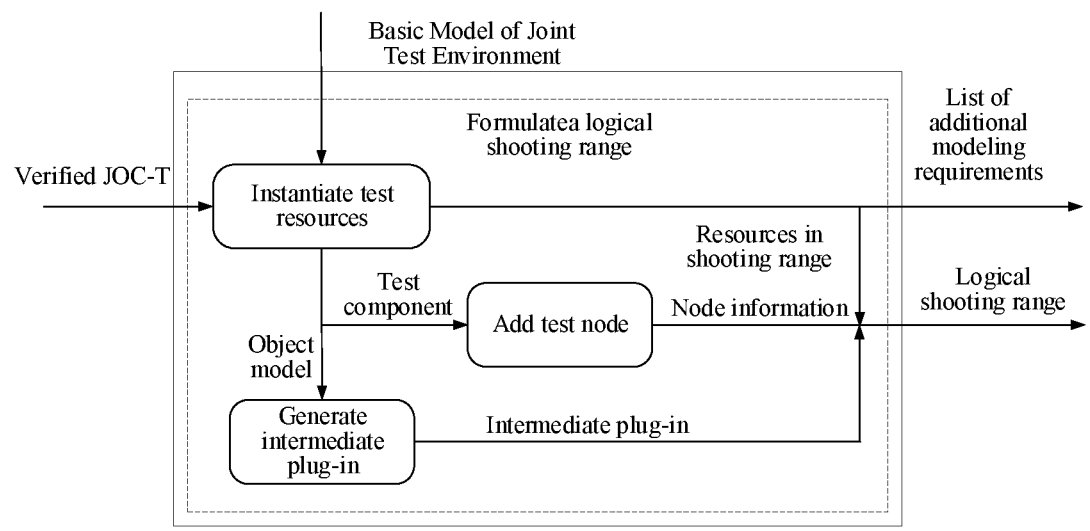
FIG. 6 is an information flow diagram of step S2 provided by the present invention.

(2) FIG. 5 illustrates the specific process of converting JOC-T into a logical shooting range. S2 reads the JOC-T information formulated in S1, instantiates test participants in JOC-T, and determines the specific equipment component participating the test, and add corresponding test nodes for these instantiated test participants, and generate middleware plug-ins based on the object model. FIG. 6 illustrates the information flow of S2.

Logical shooting range is a logical shooting range that combines resources distributed in different regions, different services, or real or virtual or structured. It is a collection of test training resources that cross regions, across virtual and real boundaries. The logical shooting range is a collection of all weapon equipment-level models that support test operations. These test resources realize the determinization of resources in the logical shooting range, and work together to complete specific test tasks through a series of shared specific object models, and realize the interconnection and interoperability of independent test resources. To complete the conversion from JOC-T to logic shooting range, the following 3 steps are required:

S21: instantiating test resources.

In this step, the resources of the joint test environment basic model cited in JOC-T need to be instantiated and turn into components that can directly participate in the test. After the test resource instantiation starts, the test designer selects its subordinate components for each test resource in JOC-T and instantiates it. After all the resources are instantiated, the definition of the resources in the logical shooting range is completed. When instantiating, not all the components of the resource model have been modeled, and the components that have not been modeled will be given to the modeler as an additional modeling requirement, and the modeler will perform modeling according to the requirement.

S22: adding a test node.

The characteristics of the logical shooting range determine that all resources in the shooting range are not necessarily in the same physical shooting range. In order to complete the joint test, the resources in the logical shooting range are usually provided by multiple physical shooting ranges. In order to distinguish the resources in different physical shooting ranges when running the test, after instantiating the test resources, it is necessary to determine the physical node of its operation according to the specific components, that is, the physical shooting range to which it belongs. So during the subsequent operation the test, it can be ensured that these test resources will participate in the test at the correct node to ensure the reliability of the test operation.

In order to avoid omissions, at the same time of completing the instantiation of test resource, that is, the component, the test node must be determined and assigned to the corresponding test node.

S23: generating an intermediate plug-in.

According to the basic model of the joint test environment corresponding to all test resources in the logical shooting range, a dynamic link library is generated to realize data transmission between test resources.

Figure 7:
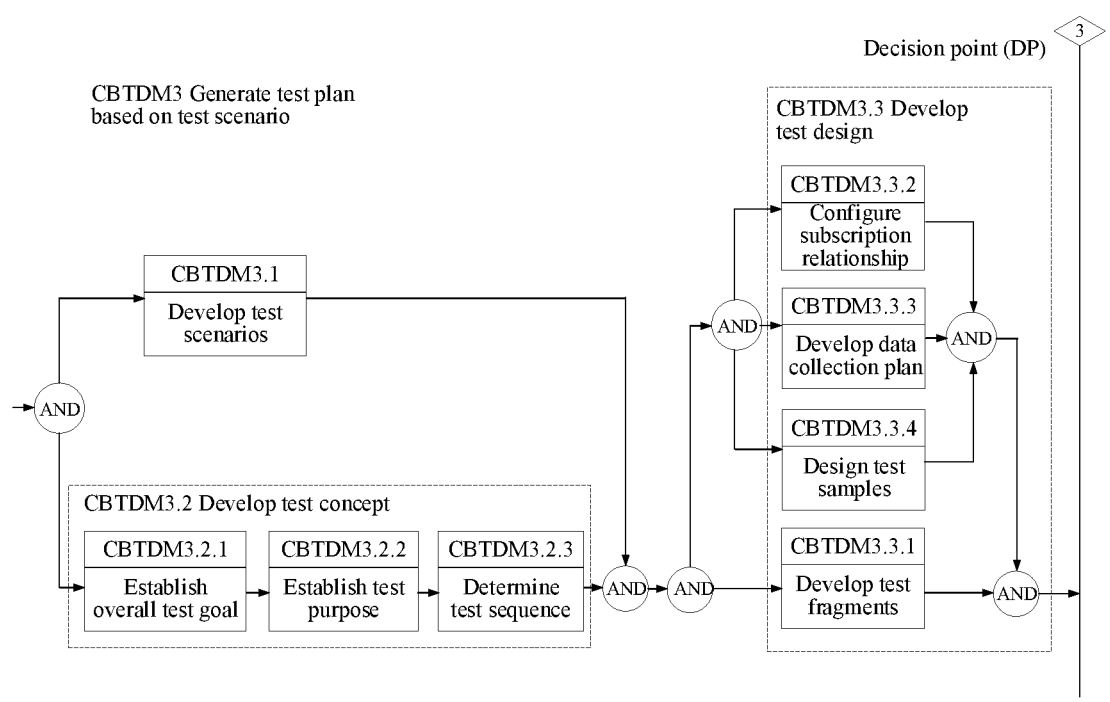
FIG. 7 is a flowchart of step S3 provided by the present invention.
Figure 8:
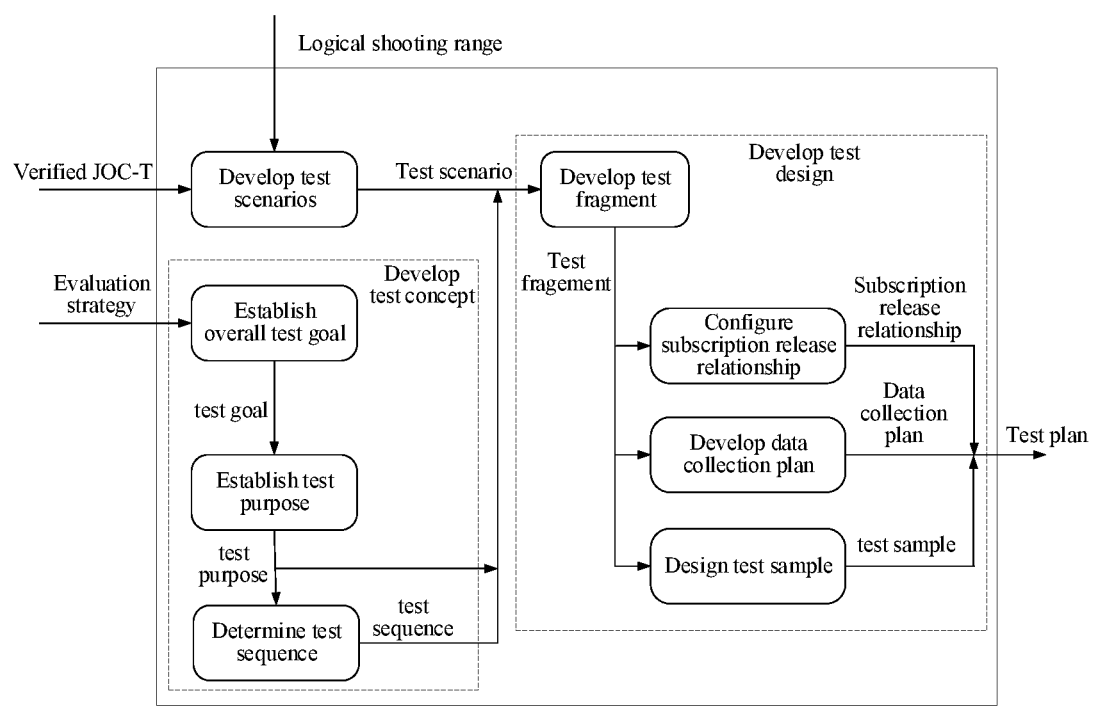
FIG. 8 is an information flow diagram of step S3 provided by the present invention.

(3) FIG. 7 illustrates the specific process of S3 to generate the test plan based on the test scenario. S3 uses the JOC-T formulated in S1 and the logical shooting range formulated in S2 to construct the test scenario, thereby determining all the test participant information in test plan; S3 uses the evaluation strategy developed in S1 to determine the concept of the test, and provides guidance for decomposing the test scene into test fragments; S3 conducts a test plan design for each test fragment after decomposing the test scene into test fragments. FIG. 8 illustrates the information flow of S3.

S31: developing a test scenario;

The test scenario is a brief description of the course of action during the test. It describes how our troops, enemy troops and the environment acted/interacted during the test event. The main purpose of the task action in the test scenario is to allow the collection of data that meets the needs of test analysis.

When formulating test scenario, the joint task background and logical shooting range of the completed test should be referred. The joint task background provides information about the relationship of test participants, and the logical shooting range provides specific test participant information, such as instantiated name of resources in the shooting range, component type, belonging node and IP address, etc.

S32: developing a test concept.

The activities carried out to formulate the test concept include the establishment of overall test goal, the establishment of test purpose and the determination of the test sequence. The completed test concept will provide guidance for the subsequent specific design process.

Capability is the ability to complete a set of tasks and achieve expected goals or effects through a series of means or methods under given standards and conditions. The capability evaluation of weapon equipment system is a comprehensive evaluation of the equipment system from the perspective of capability. Capability is the core of the entire test design process, and test plans are divided according to the capability to be identified. In order to clarify which capabilities should be designed for the test, and how the completed test plan should be implemented, an overall plan is required before the test design begins. The test concept is the overall plan to guide the entire test. The test concept consists of two parts, the test purpose and the test sequence. The test purpose describes which capabilities should be designed for the test, and the test sequence describes how the designed test plans should be carried out. The specific formulation process of the test concept includes the following 3 steps: S321: establishing an overall test target.

The overall test goal focuses the test on the specific subset of joint capabilities and the contribution to the realization of the joint mission of the system/SoS, and clarifies and refines the system/system capability from the perspective of joint test.

The first step to establish an overall test goal is to review the JOC-T formulated in step S12, which records the joint task goals of this test and the work that contributes to the success of the joint task; secondly, the test designer needs to review CCI developed in step S13 and link the related joint task goals with these applicable CCIs; finally, the joint task goals of stakeholders, capabilities, and related systems/setups are integrated into an overall test goal. The test designer should check the ICD and CDD to ensure that the test objectives can be traced back to documented capabilities and key capability indicators.

S322: establishing a test purpose.

The test purpose describes the direct purpose of the test and provides more information to describe the joint task capability and its contribution to achieving the expected results. The test purpose further concentrates the overall test goal on specific CCI, and provides guidance for the subsequent development of test fragments.

Figure 9:
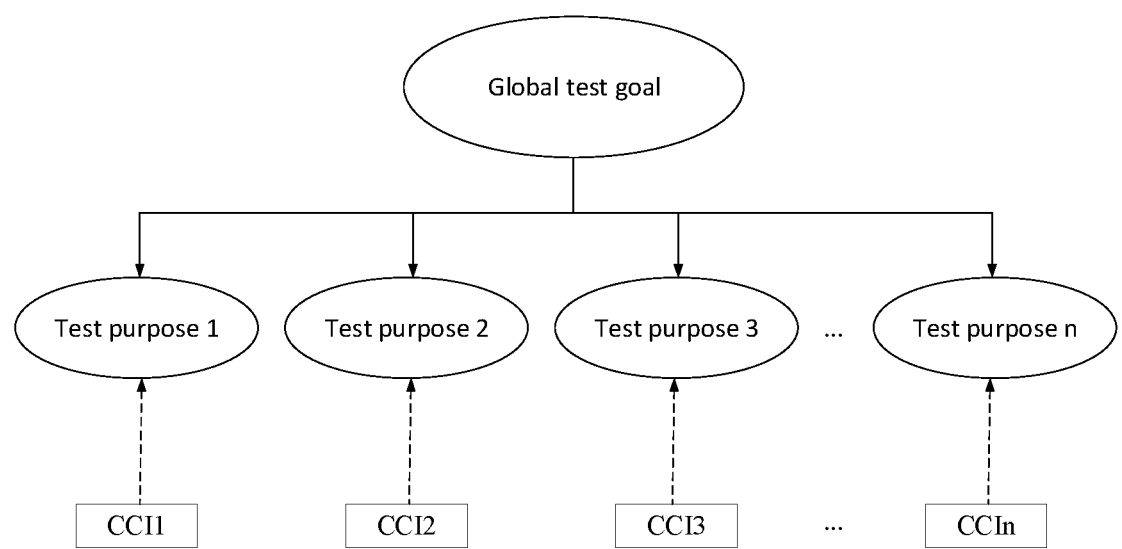
FIG. 9 is a diagram of the relationship of test goal, test purpose, and key capability issues provided by the present invention.

In order to establish the test purpose, the first is to review the test goal completed in the previous step, and the test purpose will be decomposed from the test goal; the second is to review the CCI formulated in S13. The CCI will be used as a reference for the decomposition of the test goal. A completed test purpose should be based on a specific CCI. The relationship of test goal, test purpose and CCI is shown in FIG. 9.

Due to cost constraints such as time, capital, etc., it is impossible to design and evaluate all test purposes. Therefore, it is necessary to make choices and select the part that is really necessary for the test. The selected test purposes form the test purpose list which is used as a reference for the test designer when formulating the test fragment.

S323: determining the test sequence.

After the test purpose list is established, it is determined which capabilities should be designed for the test, and the number and themes of the test events are also determined. Next, it is necessary to determine that each test event should be performed at what time, that is, determine the test sequence.

For a complex joint test project, there will be a large number of key capability issues that need to be evaluated, and a large number of test events will be generated at the same time. During the joint test, multiple test events can be carried out at the same time. This requires a test event execution plan to determine the time when the test events should be performed. The test sequence will be the overall plan during the test execution. The main content of the test sequence is the time plan for the execution of the test event. The test designer plans the test sequence for the test purpose completed in the previous step, that is, completes the time planning of the test event represented by it.

S33: developing a test design according to the test concept and test scenario.

Formulation of the test design analyze the previously completed test concept and the contents of the test scenario to formulate the detailed information of the test design, including various aspects of the test fragment, subscription release relationship, data collection plan, and test sample.

After the test concept and test scenario are completed, the test designer can begin to design specific test events. Each test event has a corresponding test fragment and test purpose. The test purpose is derived from the decomposition of the test goal according to the CCI, and it will be used as a reference to decompose the test scenario into the test fragment. The test fragment is a subset of the test scenario, which will contain all the information for running a test event. A test scenario can be decomposed into multiple test fragments, and each test fragment represents a test event. The design process of the test consists of the following 4 steps:

S331: formulating a test fragment.

Figure 10:
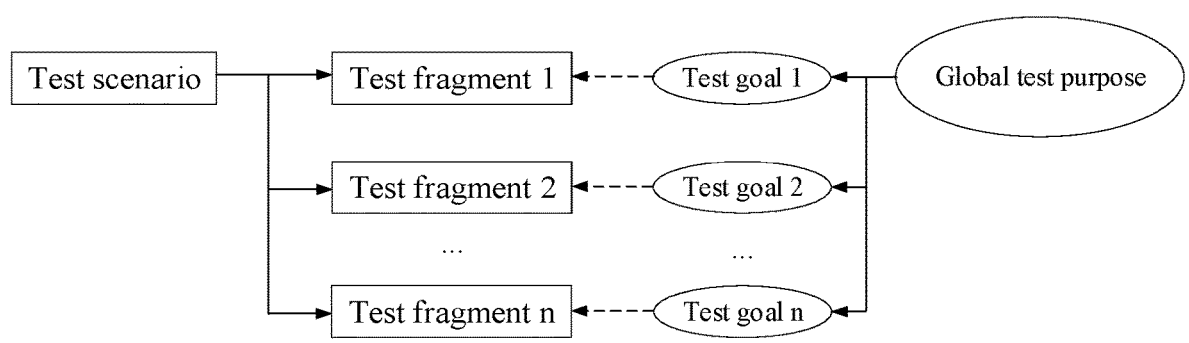
FIG. 10 is a diagram of the relationship of test scenarios, test fragments, test goal, and test purpose provided by the present invention.

The test fragment needs to be formulated according to the test scenario. The test fragment is a subset of the test scenario. The test fragment is actually a test scenario, composed of participants and the interaction of them. It can be considered that the test fragment is the product of the decomposition of the test scenario according to the test purpose. The test purpose corresponds to the key capability issue. The key capability issue is composed of four key elements, namely standards and conditions, methods and means, task set, and expected effect. Therefore, the test designer can base on the task elements in the key capability issue to break down the test scenario. As long as it is judged which test resources in the test scenario are related to the task, these test resources are part of the test fragment. In this process, the interaction of resources will be retained in the test fragment. From this, the test fragment is completed. The relationship among test scenario, test fragment, test goal, and test purpose is shown in FIG. 10.

In the subsequent design process, the test designer will add the corresponding subscription release relationship information, data collection plan information, and test sample information to the test fragment.

S332: configuring the subscription release relationship.

The subscription release information in the test plan is the basis for the middleware to transmit data for the components. It describes the object model transmitted between the subscription party and the release party of the components, that is, determines the data transmission relationship among the components during the test operation.

In the design process of the test plan, the subscription release relationship is described based on the entity, which is the product of the instantiation of the transmission object model of the test participants in the plan, including the subscription entity and the release entity. When the corresponding object model types of the subscription entity and the release entity are the same, the two entities can be established as a set of subscription release relationship. A subscription release relationship consists of subscription participant, release participant, subscription entity, release entity, and subscription party update types. When the subscription party and the release party are attributes in the object model, the subscription entity and release entity are replaced partly by subscription entity attributes or events and release entity attributes or events. The subscription participant and the release participant respectively refer to the names of the participants to which the subscription party and the release party belong, and they are determined by the test resource information that has a task interaction relationship in JOC-T. The instantiation of the test resources has been completed when the test scenario is developed, so at that stage, the correspondence between the receiver ID and the transmitter ID and names of the participants to which the subscription party and the release party belong has been completed.

The subscription entity and the release entity refer to the entity names corresponding to the subscription participant and the release participant. The subscription entity attribute or event and the release entity attribute or event name respectively refer to the corresponding subscription and release attributes of the entity. An entity is composed of several attributes and several fruit entities. The entity or attribute of the subscription release participant is determined by the transmission data type in the data interaction matrix. The transmission data type is essentially the Chinese interpretation of the entity or attribute. As long as the semantic mapping table between the data type and the object model type is established, the automatic generation of the subscription and release relationship can be realized.

The subscription party update type refers to the method of updating of the subscription release relationship data during the test operation, including two modes of direct update and variable value update, which are determined by the test designer based on the characteristics of the test.

S333: developing a data collection plan.

The test designer designs the corresponding data collection plan according to key capability indicator of the CCI corresponding to the current experiment fragment. The data collection plan will determine when, how, and by whom collecting data, recording media and formats, and collecting and receiving standards for data. At this stage, the data collection requirements should be mapped into a real data collection plan. A data collection plan contains five elements, namely storage node, participant, entity name, entity type, and collection method.

The storage node is the node on which the collection software runs and is configured by the experiment designer according to the actual situation; the participant is the collected participant, which has been determined with the completion of the test resource instantiation; the entity name and entity type are the name and type of the data to be collected, and they are determined by the data elements of the key capability indicators; the collection method is the collection method used when collecting data, which is divided into event triggering, variable value triggering and timing collection. Event triggering is to trigger the collection when a certain attribute of an entity in the entire test program is equal to a certain value; variable value triggering is to trigger the collection when a certain attribute value changes; timing collection is to collect once at intervals.

S334: designing a test sample.

The time, cost, manpower and material resources of a test are huge. In order to reduce the number of the test required, reduce the cost of the test, and shorten the cycle of the entire test, it is necessary to design the correct test sample. For this reason, it is necessary to design the corresponding test sample for each test fragment. The design process and concept are as follows.

S3341: selecting test objects, and setting test attributes and parameters.

S3342: selecting test factors from each test object.

S3343: setting the number of test levels and level values for each participating test factor according to the key capability indicator and data collection plan in S331.

S3344: selecting a test design method suitable for the selected test factors.

S3345: generating test samples according to the test design method.

Test object: An object participating in a test, such as a certain participant in a chemical experiment, whose attributes can be used as test factors.

Test factor: A parameter that participates in the test and affects the result of the test. It is a parameter of a certain object, such as the content of a certain component in a chemical experiment.

Number of factor levels: The number of variable values of the test factor. The larger the number of factor levels, the more values that can be selected for the factor, which will result in more test samples being generated.

Factor level value: the value of the test factor when participating in the test. A factor can have multiple levels.

Test sample: A permutation and combination of one level value of all test factors, corresponding to one test.

The various embodiments in this description are described in a progressive manner. Each embodiment focuses on the differences from others, and the same or similar parts among the various embodiments can be referred to each other. For the device disclosed in the embodiments, since it corresponds to the method disclosed in the embodiments, the description is relatively simple, and the relevant part can be referred to the description of the method.

The above description of the disclosed embodiments enables those skilled in the art to implement or use the present invention. Various modifications to these embodiments will be obvious to those skilled in the art, and the general principles defined herein can be implemented in other embodiments without departing from the spirit or scope of the present invention. Therefore, the present invention will not be limited to the embodiments shown in this document, but should conform to the widest scope consistent with the principles and novel features disclosed in this document.

The invention claimed is:

1. A capability test method based on a joint test support platform, the capability is defined as an ability to perform tasks to achieve the expected results through various methods and means under specific standards and conditions, comprising:

S1: describing an initial capability in a test and determining an evaluation strategy and a joint task background information of the test according to the capability to be developed based on the initial capability, wherein describing an initial capability in a test comprises searching in a database for capabilities realized by previous tests that is same or similar with capabilities to be achieved in the test, and calling the capabilities realized by previous tests that is same or similar with the capabilities to be achieved in the test;

S2: generating a logical shooting range for the joint test support platform according to the joint task background information;

S3: developing a test scenario according to the joint task background information and the logical shooting range, decomposing the test scenario, and determining a test plan corresponding to the test scenario;

S4: performing the test according to the test plan; and

S5: analyzing and evaluating test results of the test, and generating one or more joint capability evaluation reports for the test.

2. The capability test method of claim 1, wherein the S1 further comprises:

S11: formulating a capability information and a test information; the capability information is information describing the capability; the test information is information describing the test;

the capability is divided into an initial capability, a developing capability, and an output ability according to the method of the capability in the whole test design stage; the initial capability is defined as a joint capability of a test object relying on its own equipment/system or a known combination of systems or SoS at the initial stage of the test; the developing capability is defined as a joint capability formed by dividing of the test object according to task instructions at test planning stage; the output capability is defined as an actual output joint capability of test evaluation analysis stage;

S12: developing the joint task background information;

retrieving a basic model database of the joint test environment according to the capability information and test information formulated in S11, and selecting the basic model of the joint test environment suitable for the test;

selecting the equipment/system resource model and environmental resource model participating in the test according to the selected basic model of the joint test environment;

adding a task interaction relationship between the equipment/system resource model and the environmental resource model participating in the test, and generating the joint task background information;

verifying a consistency and completeness of the generated joint task background information;

S13: developing an evaluation strategy;

collecting the evaluation information;

determining a key capability issue and a key task issue according to the capability information in S11; and establishing an evaluation strategy framework.

3. The capability test method of claim 2, wherein the equipment/system resource model comprises a first-level platform model and a second-level platform model; and the environmental resource model comprises a physical environment and a human environment.

4. The capability test method of claim 2, wherein the evaluation information in S13 comprises a evaluation subject, an evaluation function, an evaluation area, an evaluation capability, and an evaluation capability level; the evaluation subject is defined as the equipment, personnel or institutions for collecting results of test performance and quantitatively evaluating the results of test performance in the evaluation process; the evaluation function is defined as behaviors and actions that the evaluation subject must perform during the evaluation process; the evaluation area is defined as a test area for the task to be evaluated, and the test area is defined by the evaluation subject based on the evaluation function; the evaluation capability is defined as a related capability to be evaluated; and the capability level is defined as the capability evaluation standard for evaluating and dividing the joint capability to be evaluated.

5. The capability test method of claim 2, wherein the key capability issue in S13 is analytical statement for evaluating performance of relating capability of a joint mission; basic elements of the key capability issue comprise task set, mission expected effect, test standard, test condition, test method, and test means; the key task issue is defined as the analytical statement of design task efficiency and mission adaptability;

the evaluation strategy framework is divided into independent factor and dependent factor according to measured dependence; the independent factor comprises joint mission and task, environmental condition, and system configuration option; the dependent factor comprises joint mission effectiveness measurement, task performance measurement and system property measurement.

6. The capability test method of claim 2, wherein the S2 further comprises:
S21: instantiating test resources; selecting a subordinate component of the test resource in the basic model of the joint test environment to instantiate;
S22: adding test node; determining a physical node running by the component according to the instantiated component, so that the test resource participates in the test at the correct physical node;
S23: generating an intermediate plug-in; and generating a dynamic link library to realize data transmission among test resources according to the basic model of the joint test environment corresponding to all test resources in the logical shooting range.

7. The capability test method of claim 2, wherein the S3 further comprises:
S31: developing a test scenario; wherein the test scenario is a brief description of the action/interaction relationship between our troops, enemy troops and the environment during the test;
S32: developing a test concept; wherein the developing a test concept comprises establishing an overall test goal, establishing a test purpose, and determining a test sequence;
S33: developing a test design according to the test concept and the test scenario;
wherein the test design is a specific plan during test operation.

8. The capability test method of claim 7, wherein the S32 further comprises:
S321: establishing an overall test goal; obtaining the joint task goal of the test according to the joint task background information in S12; associating the available joint task goal with the available key capability issue in S13; integrating a stakeholder, capability and joint mission objective into the overall test goal;
S322: developing a test purpose; decomposing the global test goal in S321 into the test purpose according to the key capability issue in S13, and each test purpose is based on a specific key capability issue; and
S323: determining the test sequence; sorting the developed test purpose according to priority and time.

9. The capability test method of claim 7, wherein the S33 further comprises:
S331: developing a test fragment;
decomposing the test scenario specified in step S31 into a plurality of test fragments as a test event during test operation by taking the test purpose in S32 as a reference;
S332: configuring a subscription release relationship;
adding the subscription release relationship for the task interaction relationship among test resources, and determining a data transmission relationship and type among test resources;
S333: formulating a data collection plan:
determining a key capability indicator needed for collecting by the current test fragment according to the test fragments in step S331 and the corresponding key capability issue, and formulating the corresponding data collection plan; and
Step S334: designing a test sample:
developing a corresponding test sample for each test fragment according to the key capability indicator and the data collection plan in S331.

10. The capability test method of claim 9, wherein the S334 further comprises:
S3341: selecting test objects, and setting test attributes and parameters;
S3342: selecting the test factor from each test object;
S3343: setting the number of test level and level value for each participating test factor according to the key capability indicator and the data collection plan in the S331;
S3344: selecting a test design method suitable for the selected test factor, and
S3345: generating the test sample according to the test design method.

* * * * *